(12) United States Patent
Aoki et al.

(10) Patent No.: US 9,156,123 B2
(45) Date of Patent: Oct. 13, 2015

(54) DOUBLE-SIDE POLISHING METHOD

(71) Applicant: SHIN-ETSU HANDOTAI CO., LTD., Tokyo (JP)

(72) Inventors: Kazuaki Aoki, Nishigo-mura (JP); Shigeru Oba, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 14/350,933

(22) PCT Filed: Oct. 4, 2012

(86) PCT No.: PCT/JP2012/006374
§ 371 (c)(1),
(2) Date: Apr. 10, 2014

(87) PCT Pub. No.: WO2013/069198
PCT Pub. Date: May 16, 2013

(65) Prior Publication Data
US 2014/0256227 A1    Sep. 11, 2014

(30) Foreign Application Priority Data

Nov. 7, 2011    (JP) .................. 2011-243342

(51) Int. Cl.
| | |
|---|---|
| *B24B 49/03* | (2006.01) |
| *B24B 49/16* | (2006.01) |
| *B24B 37/005* | (2012.01) |
| *B24B 37/08* | (2012.01) |

(Continued)

(52) U.S. Cl.
CPC .............. *B24B 37/08* (2013.01); *B24B 37/042* (2013.01); *B24B 49/00* (2013.01); *B24B 49/03* (2013.01); *H01L 21/02024* (2013.01); *H01L 22/12* (2013.01); *H01L 22/20* (2013.01)

(58) Field of Classification Search
CPC ...... B24B 49/006; B24B 49/02; B24B 49/03; B24B 49/04; B24B 49/16; B24B 37/005; B24B 37/042; B24B 37/08

USPC .............. 451/5, 8, 9, 10, 11, 41, 268, 269
See application file for complete search history.

(56) References Cited

U.S. PATENT DOCUMENTS

| | | | |
|---|---|---|---|
| 2008/0138721 A1 | 6/2008 | Hiramoto et al. | |
| 2011/0130073 A1* | 6/2011 | Furukawa et al. | ............... 451/6 |
| 2013/0032573 A1* | 2/2013 | Ogata et al. | ................... 216/53 |

FOREIGN PATENT DOCUMENTS

| | | |
|---|---|---|
| JP | A-5-177539 | 7/1993 |
| JP | A-2000-271859 | 10/2000 |

(Continued)

OTHER PUBLICATIONS

International Search Report issued in International Application No. PCT/JP2012/006374 mailed Oct. 30, 2012.

(Continued)

*Primary Examiner* — Eileen Morgan
(74) *Attorney, Agent, or Firm* — Oliff PLC

(57) ABSTRACT

The present invention is directed to a double-side polishing method including interposing a wafer held by a carrier between upper and lower turn tables to which respective polishing pads are attached, and rotating and revolving the carrier while supplying a polishing agent to polish both surfaces of the wafer at the same time, the method including the steps of: first polishing at a high polishing rate; second polishing at a low polishing rate; measuring flatness of the polished wafer; and determining polishing conditions of the second polishing in a next polishing batch on a basis of the measured flatness. The method can stably improve the flatness of a wafer without being affected by variations in carrier thickness over time.

4 Claims, 8 Drawing Sheets

(51) Int. Cl.
  *B24B 37/04* (2012.01)
  *H01L 21/02* (2006.01)
  *H01L 21/66* (2006.01)
  *B24B 49/00* (2012.01)

(56) References Cited

FOREIGN PATENT DOCUMENTS

| JP | A-2004-14780 | 1/2004 |
| JP | A-2008-142802 | 6/2008 |
| WO | WO 2010/013390 A1 | 2/2010 |

OTHER PUBLICATIONS

International Preliminary Report on Patentability issued in International Patent Application No. PCT/JP2012/006374 dated May 13, 2014.

Office Action Issued in Japanese Patent Application No. 2011-243342 dated Jun. 10, 2014 (with partial translation).

* cited by examiner

DOUBLE-SIDE POLISHING METHOD

TECHNICAL FIELD

The present invention relates to a double-side polishing method for polishing both surfaces of a wafer at the same time while supplying a polishing agent.

BACKGROUND ART

As the line width of semiconductor circuits is shrunk, stricter requirements for flatness of semiconductor wafers used as substrates of the circuits have been imposed. In such situations, large-diameter wafers are polished by a double-side polishing method, which ensures a higher polishing precision, instead of a conventional single-side polishing method.

Examples of the double-side polishing apparatus include a planetary gear type of double-side polishing apparatus, as depicted in FIG. 6, and a swinging type of double-side polishing apparatus, as depicted in FIG. 7. The planetary gear type of double-side polishing apparatus has a lower turn table and an upper turn table movable upward and downward, and is capable of pressing the upper turn table against the lower turn table to apply load to wafers interposed between the upper and lower turn tables. As depicted in FIG. 6, the double-side polishing apparatus 101 has a sun gear 107 provided inside the lower turntable and an internal gear 108 provided outside the lower turn table.

Furthermore, between the upper and lower turn tables, carriers 105 for holding wafers are provided, and each of the carriers 105 engages at its periphery the sun gear and the internal gear and thereby can rotate. The carrier rotates about its own axis and revolves with respect to the axis between the upper and lower turn tables according to the rotational speed of the sun gear and the internal gear. Wafers being polished are inserted and held in the respective holding holes 106 provided in the carrier are polished without flying out of the double-side polishing apparatus.

On the other hand, as depicted in FIG. 7, the swinging type of double-side polishing apparatus 111 has a carrier 105 for holding wafers provided between rotating upper and lower turn tables, and imparts a circular movement to the carrier 105, without rotating the carrier, to polish the wafers.

The planetary gear type of double-side polishing apparatus can rotate and revolve the carrier at a higher rotational speed and at a higher revolution speed than the swinging type of double-side polishing apparatus, and promote rotational movement of the wafers during polishing, thereby enabling the wafers to be polished with flatness higher than the swinging type of double-side polishing apparatus. The planetary gear type accordingly becomes recent mainstream of the double-side polishing apparatus.

Here, it has been known that, for the planetary gear type double-side polishing apparatus, the flatness of the polished wafer varies depending on the relationship between the thickness of a carrier and the thickness of the wafer at the end of polishing, that is, a finishing thickness of the wafer (See Patent Document 1, for example). For a finishing thickness thicker than the thickness of the carrier, for example, a wafer sinks into a polishing pad due to a polishing load so that pressure on the outer circumference portion of the wafer becomes higher than that on the central portion of the wafer. As a result, the higher pressure promotes polishing of the outer circumference portion, creating an outer circumference portion thinner than the central portion, that is, a so-called outer circumference sag, which tends to make the entire shape of the wafer convex.

Conversely, for a finishing thickness thinner than the thickness of the carrier, sinking a wafer into a polishing pad is mitigated (i.e., a retainer effect) so that pressure on the outer circumference portion becomes lower than that on the central portion. As a result, the outer circumference portion becomes thicker than the central portion, that is, a so-called outer circumference rise is created, which tends to make the entire shape of the wafer concave.

Accordingly, the flatness is conventionally adjusted by adjusting the finishing thickness of a wafer with respect to the thickness of a carrier. In general, a polishing process includes a first polishing in which rough polishing is performed at a high polishing rate and a second polishing in which fine polishing is performed at a low polishing rate, and the finishing thickness is adjusted by changing a polishing time of the first polishing. Polishing a wafer into a highly flat wafer needs an optimum finishing thickness with respect to the thickness of a carrier.

The finishing thickness of and the flatness of a polished wafer are measured with a flatness measuring device provided separately from a double-side polishing apparatus after the polished wafer is taken of the apparatus by an operator. After the measurement, the wafer is put back into the double-side polishing apparatus. The finishing thickness in a next polishing batch is determined to set the polishing time on the basis of the measurement result of the flatness. Since such measurement, involving taking out a wafer after every polishing batch, leads to reduction of apparatus's productivity and of operator's productivity, the measurement is performed every multiple polishing batches.

CITATION LIST

Patent Literature

Patent Document 1: Japanese Unexamined Patent Application Publication No. H05-177539

SUMMARY OF INVENTION

Technical Problem

Unfortunately, a finishing thickness that enables overall flatness, such as a global backside ideal range (GBIR), of a wafer to be high is not necessarily equal to a finishing thickness that enables circumferential flatness, a site front least squares range (SFQR) and an edge SFQR (ESFQR), of the wafer to be high. Even when a wafer is finished with a finishing thickness enabling a good GBIR, the outer circumference rise or outer circumference sag may occur, resulting in a worse circumferential flatness (a worse SFQR or ESFQR). The adjustment of the finishing thickness in the above manner is insufficient to improve wafer flatness. In addition, the above method using the thickness of a carrier as a reference cannot take into consideration variations in carrier thickness due to wear over time.

In recent years, as requirements of circumferential flatness of wafers become stricter to reduce cost of semiconductor devices, the outer circumference rise and sag are regarded as important issues even in a range that has not been questioned so far. It is difficult to obtain polished wafers with good overall flatness and good circumferential flatness by a conventional method, e.g., as described above.

The present invention has been made in view of the problems described above and an object of the present invention is to provide a double-side polishing method that can stably improve wafer flatness without being affected by variations in the carrier thickness over time.

Solution to Problem

To attain the above-described object, the present invention provides a double-side polishing method including interposing a wafer held by a carrier between upper and lower turn tables to which respective polishing pads are attached, and rotating and revolving the carrier while supplying a polishing agent to polish both surfaces of the wafer at the same time, the method comprising the steps of: first polishing at a high polishing rate; second polishing at a low polishing rate; measuring flatness of the polished wafer; and determining polishing conditions of the second polishing in a next polishing batch on a basis of the measured flatness.

Such a double-side polishing method can effectively improve the flatness on the basis of the measured flatness in the current polishing batch without being affected by variations in the carrier thickness over time because the carrier thickness is not used as a reference. In addition, use of in-line measurement of the flatness allows reduction in productivity to be avoided.

At this time, the measured flatness preferably includes overall flatness represented by a cross-sectional shape passing through a center of the wafer and circumferential flatness represented by a sag shape or a rise shape of an outer circumference portion of the wafer.

Such a method can determine the polishing conditions of the second polishing in more detail on the basis of each of the measured overall flatness and circumferential flatness, improving the flatness more effectively.

More specifically, the step of determining the polishing conditions of the second polishing may determine at least one of a polishing load, a rotational speed of the carrier, a revolution speed of the carrier, a rotational speed of the upper turn table, a rotational speed of the lower turn tables, and a polishing time.

The polishing conditions of the second polishing may specifically be determined in such a manner, and particularly in the event that the overall flatness and the circumferential flatness are measured, both of the flatness can be effectively improved.

Moreover, the step of determining the polishing conditions of the second polishing may determine the polishing conditions such that, if the measured circumferential flatness is the rise shape, then a polishing load is decreased and a rotational speed of the upper and lower turn tables and a rotational speed of and a revolution speed of the carrier are increased compared with those of a current polishing batch, and if the measured circumferential flatness is the sag shape, then the polishing load is increased and the rotational speed of the upper and lower turn tables and the rotational speed of and the revolution speed of the carrier are decreased compared with those of the current polishing batch.

Such polishing conditions affect the polished wafer such that if the measured circumferential flatness is the rise shape, then the wafer is apt to be concave, and if the measured circumferential flatness is the sag shape, then the wafer is apt to be convex. The inventive method can combine such determination of polishing conditions and adjustment of the overall flatness by using the finishing thickness to improve both the overall flatness and the circumferential flatness.

More specifically, if the measured circumferential flatness is the rise shape, then a polishing time of the first polishing may be determined such that a finishing thickness becomes thicker than that of the current polishing batch, and if the circumferential flatness is the sag shape, then the polishing time of the first polishing may be determined such that the finishing thickness becomes thinner than that of the current polishing batch.

Such adjustment of the polishing time affect the polished wafer as follows: if the measured circumferential flatness is the rise shape, then the wafer is apt to be convex, and consequently both the overall flatness and the circumferential flatness can be improved due to combination with the above effect of a wafer being apt to be concave because of changed polishing conditions of the second polishing; and if the measured circumferential flatness is the sag shape, then the wafer is apt to be concave, and consequently both the overall flatness and the circumferential flatness can be improved due to combination with the above effect of a wafer being apt to be convex because of changed polishing conditions of the second polishing.

Advantageous Effects of Invention

The inventive double-side polishing method of a wafer involves measuring the flatness of the polished wafer and determining polishing conditions of the second polishing in a next polishing batch on the basis of the measured flatness, thereby enabling wafer flatness to be stably improved without being affected by variations in carrier thickness over time. In addition, overall flatness and circumferential flatness can stably be improved by measuring the overall flatness and the circumferential flatness to determine the polishing conditions of the second polishing on the basis of these measurement results.

DESCRIPTION OF EMBODIMENTS

Hereinafter, embodiments of the present invention will be described, but the present invention is not limited thereto.

As described earlier, a conventional double-side polishing method, involving adjustment of a finishing thickness according to the carrier thickness for improvement in flatness, is unable to sufficiently improve the flatness and has a problem of a further improvement in the flatness, particularly at the outer circumference portion of a wafer. In addition, the conventional method cannot take into consideration the variations in carrier thickness due to wear over time.

The present inventors conducted a great deal of study to solve these problems, and found the following. The flatness of a wafer is measured after every polishing batch, and the measurement result is reflected in polishing conditions, such as a polishing load and a rotational speed of upper and lower turn tables, of the second polishing in a next polishing batch. Such a method enables a wafer to be stably polished into a wafer with high flatness without being affected by variations in carrier thickness over time. The inventors also found that both of overall flatness and circumferential flatness can be improved by using a finishing thickness changed from that of a current polishing batch and other polishing conditions, such as a polishing load, a rotational speed of an upper and lower turn tables, a rotational speed of and a revolution speed of a carrier, and a polishing time, of the second polishing, which are determined on the basis of the measurement result of the overall flatness and the circumferential flatness, thereby brought the present invention to completion.

Figure 2:
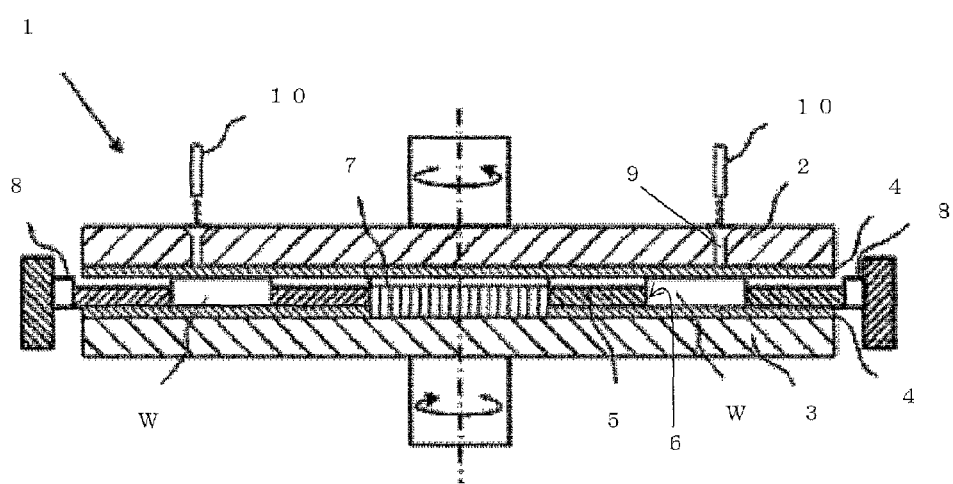
FIG. 2 is a schematic diagram of an example of a double-side polishing apparatus usable in the double-side polishing method of the present invention.

A double-side polishing apparatus usable in the double-side polishing method of the present invention will now be described. As depicted in FIG. 2, a double-side polishing apparatus 1 includes a cylindrical upper turn table 2 and a cylindrical lower turn table 3, to which respective polishing pads 4 are attached such that a polishing face of one of the polishing pads faces a polishing face of the other polishing pad. Examples of the polishing pad 4 include a polishing pad obtained by impregnating a nonwoven fabric with urethane resin and a polishing pad formed of urethane foam. A sun gear 7 is attached to the inside of the lower turn table 3 and an internal gear 8 is attached to the outside of the lower turn table 3. The upper and lower turn tables 2 and 3, the sun gear 7, and the internal gear 8 have the same central axis of rotation and can independently rotate about the central axis.

Figure 3A:
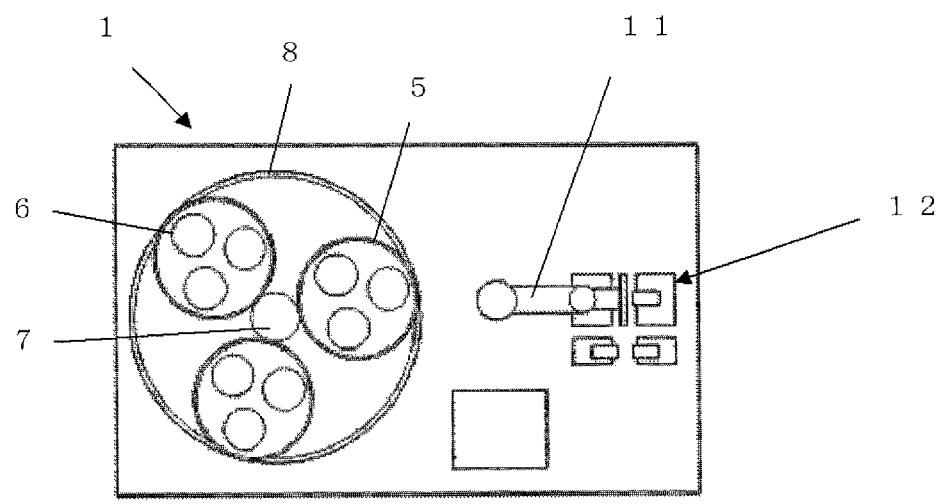
FIG. 3A is a schematic top view of an example of a double-side polishing apparatus, usable in the inventive double-side polishing method, that is provided with a robot for transporting a wafer automatically.

As depicted in FIG. 3A, a plurality of carriers 5, each of which are provided with holding holes 6 for holding wafers W, are configured to be interposed between the upper and lower turn tables 2 and 3. Each of the carriers 5 are thus provided with a plurality of holding holes 6 to polish a plurality of wafers W every polishing batch. The carriers 5 engage the sun gear 7 and the internal gear 8 and are configured to rotate about its own axes and to revolve around the central axis between the upper and lower turn tables according to the rotational speed of the sun gear 7 and the internal gear 8. The wafers W are inserted and held in the respective holding holes 6 of such carriers 5, and the upper turn table 2 descends to interpose the wafers W and the carriers 5 and applies a polishing load to the wafers. The double-side polishing apparatus is configured to rotate the upper turn table 2 in one rotational direction and the lower turn table 3 in the other rotational direction while supplying a polishing agent supplied from nozzles 10 into between the upper and lower turn tables through through-holes 9 provided in the upper turn table 2, whereby the both surfaces of the wafers W are polished at the same time.

Figure 3B:
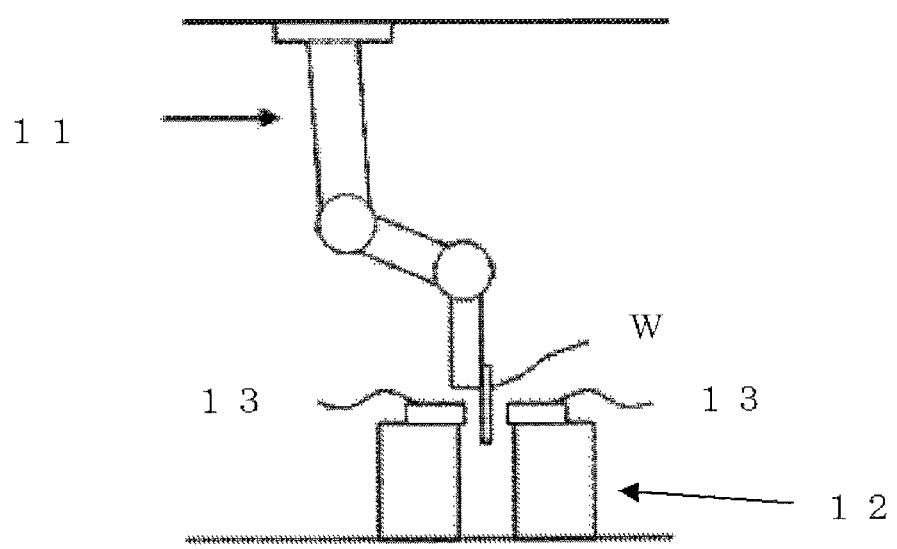
FIG. 3B is a side view enlarging the robot in FIG. 3A.

As depicted in FIG. 3A and FIG. 3B, the double-side polishing apparatus usable in the inventive double-side polishing method is provided with a robot 11 for transporting a wafer automatically (hereinafter, briefly referred to as a robot) and a thickness measuring instrument 12 for measuring a finishing thickness of the polished wafers. The thickness measuring instrument 12 has two displacement sensors 13, which are spaced and face each other, and is configured to determine the thickness of a wafer W by using differences in position measured by each of the displacement sensors when the wafer W is inserted into the space between the two displacement sensors. Examples of the displacement sensor 13 usable herein include a contact displacement sensor and a non-contact displacement sensor, such as a capacitive displacement sensor and a laser displacement sensor. The non-contact type displacement sensor is preferable in consideration of an influence of wafer scratches. The double-side polishing apparatus thus enables in-line measurement of the thickness of a wafer.

Figure 4:
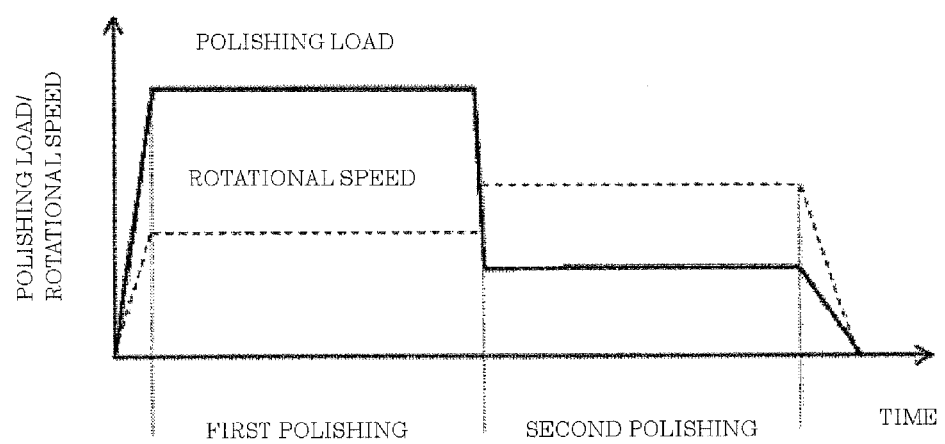
FIG. 4 is an explanatory diagram of first polishing and second polishing in the double-side polishing method of the present invention.

As depicted in FIG. 4, the double-side polishing method of the present invention uses such a double-side polishing apparatus to polish a wafer by two polishing processes: a first polishing at a high polishing rate and a second polishing at a low polishing rate. Here, the first polishing is a process, for mainly removing mechanical distortion and pits caused in a previous process on wafer surfaces, performed with a higher polishing load at a higher polishing rate to improve productivity. The second polishing is a process, for mainly adjusting the flatness, performed at a lower polishing rate under polishing conditions appropriately determined on the basis of the flatness measured in a previous polishing batch. It is to be noted that the above-described configuration of the double-side polishing apparatus used in the present invention is merely an example and the present invention is not limited this configuration.

The double-side polishing method of the present invention will be more specifically described below with referenced to FIG. 1.

Figure 1:
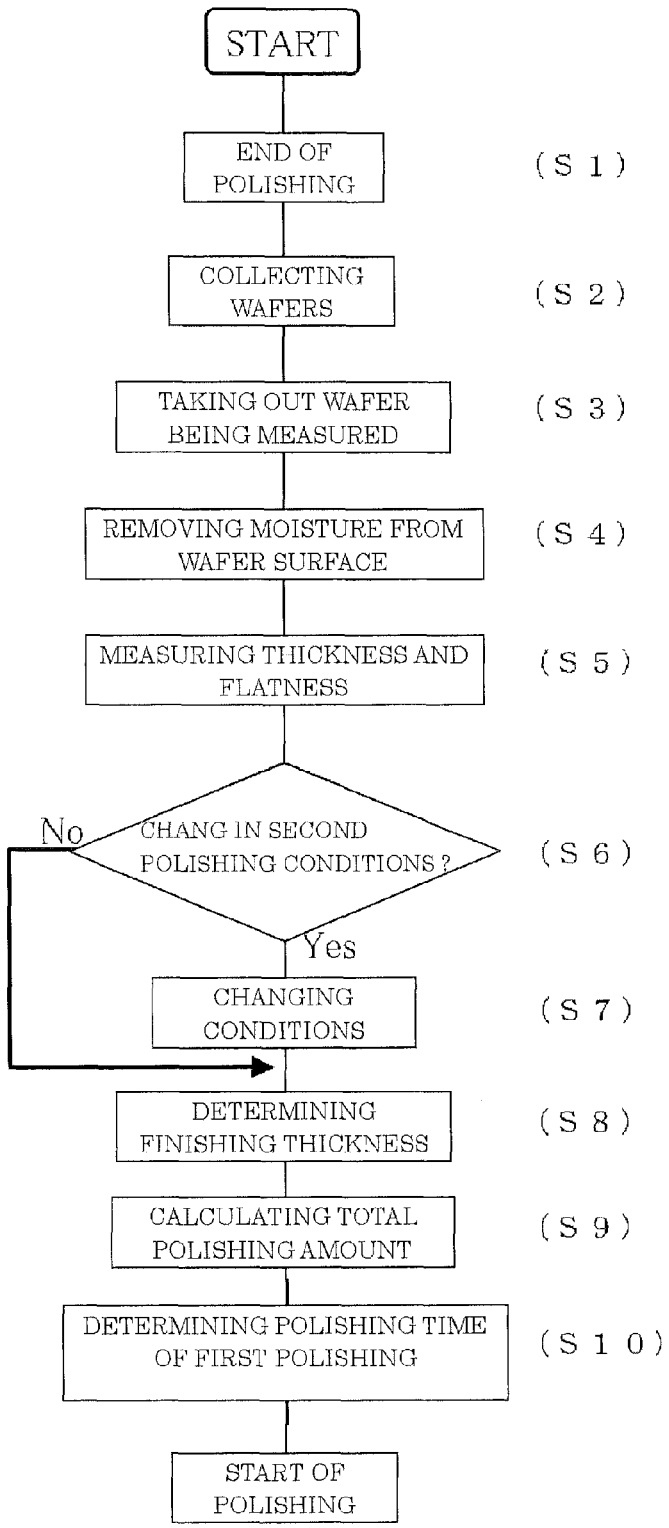
FIG. 1 is a flow diagram of an example of a double-side polishing method of the present invention.

As depicted in FIG. 1, wafers polished in a previous polishing batch (FIG. 1 at S1) are collected from the double-side polishing apparatus by the robot (FIG. 1 at S2) and put in a tank. After all the wafers are collected from the double-side polishing apparatus, the apparatus takes one of the wafers to be measured out of the tank with the robot (FIG. 1 at S3), remove moisture on the wafers with a blower if necessary (FIG. 1 at S4), and measures the finishing thickness and the flatness (FIG. 1 at S5).

The finishing thickness may be measured by the thickness measuring instrument. At this time, the number of wafers used for measurement may be one or more among the wafers polished in a single batch, and an average value thereof is used for measurement on two or more wafers. The finishing thickness may be an average for thicknesses at positions on a lateral line passing through the center of a wafer.

The measured flatness may include overall flatness represented by a cross-sectional shape passing through a center of the wafer and circumferential flatness represented by a sag shape or a rise shape of an outer circumference portion of the wafer.

The flatness can be measured by a flatness measuring instrument. As described below, the flatness may also be expressed by a numeral value calculated from measured thicknesses as follows: the thicknesses are measured by the thickness measuring instrument; and the flatness is then calculated from the measured thicknesses. For example, the overall flatness may be a difference between the maximum value and the minimum value of the thicknesses measured at multiple positions, and the circumferential flatness may be a difference between a thickness at 3 mm apart from the wafer periphery and a thickness at 1 mm apart from the wafer periphery. It is preferable, but not limited, to calculate the flatness from the wafer thickness obtained by the in-line measurement to avoid reduction in productivity, unlike a conventional method involving measuring the flatness by a flatness measuring instrument provided separately from the double-side polishing apparatus.

Next, the polishing conditions in the second polishing in a next polishing batch on the basis of the measured flatness (FIG. 1 at S6 and S7). At this time, if the measured flatness, particularly the circumferential flatness, is good, then the polishing conditions in the second polishing may be the same as those in the current polishing batch. The finishing thickness in the next polishing batch is then determined on the basis of the measured flatness (FIG. 1 at S8).

Next, a total polishing amount needed is calculated from a difference between a wafer thickness before polishing and the determined finishing thickness (FIG. 1 at S9), and a polishing time needed in the first polishing is calculated with reference to polishing rates recorded in the past and set.

Then, polishing of wafers is started under the polishing conditions determined in such a manner.

Such an inventive double-side polishing method can effectively improve the flatness on the basis of the measured flatness in the current polishing batch without being affected by variations in the carrier thickness over time because the carrier thickness is not used as a reference. In addition, use of in-line measurement of the flatness allows reduction in productivity to be avoided.

The measurement of the flatness including the overall flatness and the circumferential flatness enables determination of more specific polishing conditions of the second polishing on the basis of each of the measured overall flatness and circumferential flatness to improve the flatness more effectively.

Specific polishing conditions of the second polishing determined in the above step may include at least one of a polishing load, a rotational speed of the carrier, a revolution speed of the carrier, a rotational speed of the upper turn table, a rotational speed of the lower turn tables, and a polishing time.

In such a manner, particularly in the event that the overall flatness and the circumferential flatness are measured, both of the overall flatness and the circumferential flatness can be effectively improved.

Here, the polishing load may be 50 to 300 $g/cm^2$, the upper and lower turn tables may be 1 to 50 rpm, and the polishing time may be in the range of 25 minutes or less, for example. The rotational speed and revolution speed of the carrier can be adjusted by the rotational speed of the upper and lower turn tables, of the sun gear, and of the internal gear, and the rotational speed of the sun gear and of the internal gear may be the same as that of the upper and lower turn tables.

More specifically, the polishing conditions is preferably determined as follows:

If the measured circumferential flatness is a rise shape, then the polishing load is decreased and the rotational speed of the upper and lower turn tables and the rotational speed of and the revolution speed of the carrier are increased compared with those of the current polishing batch. Under the decreased polishing load, the increased rotational speed of the upper and lower turn tables, and hence the increased revolution speed of the carrier, a polishing agent readily reaches the central portion of the wafer. In addition, the central portion of the wafer is heated to a temperature higher than that of the circumferential portion because of heat generated by polishing and less cooling effect of the polishing agent. From these two reasons, mechanical polishing and chemical polishing are promoted at the central portion of the wafer compared with at the circumferential portion, and hence the polishing rate is higher at the central portion than the circumferential portion so that the wafer tends to be formed in a concave shape.

Meanwhile, if the measured circumferential flatness is a sag shape, then the polishing load is increased and the rotational speed of the upper and lower turn tables and the rotational speed of and the revolution speed of the carrier are decreased compared with those of the current polishing batch. Under such conditions, the polishing agent, in contrast to the above conditions, hardly reaches the center portion of the wafer, and hence the polishing rate is lower at the central portion than the circumferential portion so that the wafer tends to be formed in a convex shape.

The polishing conditions are thus determined such that the wafer tends to be formed in a concave or convex shape, besides the overall flatness is adjusted by determining a proper finishing flatness so that combination of these determinations enables both the overall flatness and the circumferential flatness to be improved.

In an exemplary case where the measured overall flatness is a convex shape and the measured circumferential flatness is a rise shape, the polishing load is decreased and the rotational speed of the upper and lower turn tables and the rotational speed of and the revolution speed of the carrier are increased compared with those of the current polishing batch so that the wafer tends to be formed in a concave shape, and the finishing thickness is increased so that the wafer tends to be formed in a convex shape. Under the determined conditions, both the overall flatness and the circumferential flatness can be improved. In contrast, in an exemplary case where the measured overall flatness is a concave shape and the measured circumferential flatness is a sag shape, the polishing load is increased and the rotational speed of the upper and lower turn tables and the rotational speed of and the revolution speed of the carrier are decreased compared with those of the current polishing batch so that the wafer tends to be formed in a convex shape, and the finishing thickness is decreased so that the wafer tends to be formed in a concave shape. Under the determined conditions, likewise, both the overall flatness and the circumferential flatness can be improved.

It is to be noted that conventional methods, if the overall flatness is a convex shape and the circumferential flatness is a rise shape, merely decrease the finishing thickness to improve the convex shape of the overall flatness. The rise shape of the circumferential portion is therefore developed due to the retainer effect of a carrier, which mitigates sinking of a wafer into a polishing pad.

The present invention, as described above, determines polishing conditions to shift the circumferential flatness from the rise and sag shapes to the concave and convex shapes, respectively, and, according to this determination, the finishing thickness to make the overall flatness flat, thereby improving both the overall and circumferential flatness.

If the circumferential flatness is neither the rise shape nor the sag shape as above, but flat, the polishing conditions of the second polishing may be the same as those of the current polishing batch. In this case, the polishing time of the first polishing is changed to adjust the finishing thickness so that the overall flatness is improved. Specifically, the polishing time of the first polishing may be determined in such a manner that if the overall flatness is the concave shape, then the finishing thickness is increased from that of the current polishing batch, and if the overall flatness is the convex shape, then the finishing thickness is decreased from that of the current polishing batch.

The polishing time of the second polishing is preferably determined to be a time required for securing a polishing amount sufficient for the above shape adjustment, and may be, but not limited to, a time required for securing a polishing amount of 1.5 to 5.0 µm.

EXAMPLES

Hereinafter, the present invention will be described more specifically with an example and a comparative example of the present invention, but the present invention is not limited to these examples.

Example

Wafers were polished with a double-side polishing apparatus capable of in-line measurement of the flatness in accordance with the double-side polishing method of the present invention as shown in FIG. 1, and the flatness was evaluated. The polished wafers were 300-mm-diameter silicon wafers prepared by slicing a silicon single crystal ingot produced by the Czochralski (CZ) method, chamfering the edge of the wafers, and lapping and polishing the wafers. The double-side polishing apparatus had urethane foam polishing pads on both sides of the upper and lower turn tables. The polishing agent containing colloidal silica grains with a pH of 10.0 to 11.0 was used.

The polishing conditions in the first batch were determined as follows:

In the first polishing, the polishing load was 250 g/cm$^2$, and the rotational speeds of the upper and lower turn tables and of the sun and internal gears were determined such that both the difference between the revolution speed of the carrier and the rotational speed of the upper turn table and the difference between the rotational speed of the lower turn table and the revolution speed of the carrier became 20 rpm; The rotational speed of the carrier was 1 rpm;

In the second polishing, the polishing load was 180 g/cm$^2$, and the rotational speeds of the upper and lower turn tables and the sun and internal gears were determined in the same manner as the first polishing; and The polishing time of the second polishing was 3.5 minutes, and the polishing time of the first polishing was determined such that the finishing thickness became 777 μm.

The wafers were polished under such polishing conditions, and the flatness of each of the polished wafers was measured. As a result, the overall flatness was a convex shape and the circumferential flatness was a rise shape. Accordingly, the polishing conditions of the second polishing process in the second batch were determined as follows:

The polishing load was decreased to 130 g/cm$^2$, and the rotational speeds of the upper and lower turn tables and the rotational speed of and the revolution speed of the carrier were increased such that both the difference between the revolution speed of the carrier and the rotational speed of the upper turn table and the difference between the rotational speed of the lower turn table and the revolution speed of the carrier became 25 rpm; The rotational speed of the carrier was increased to 4 rpm; The finishing thickness was increased to 780 μm; and the polishing time of the second polishing was 6 minutes.

The polishing conditions of the first polishing were determined to be the same as those of the first batch except that the polishing time was changed such that the finishing thickness became 780 μm. The wafers were polished under such polishing conditions, and the flatness of the polished wafers was measured.

Figure 5:
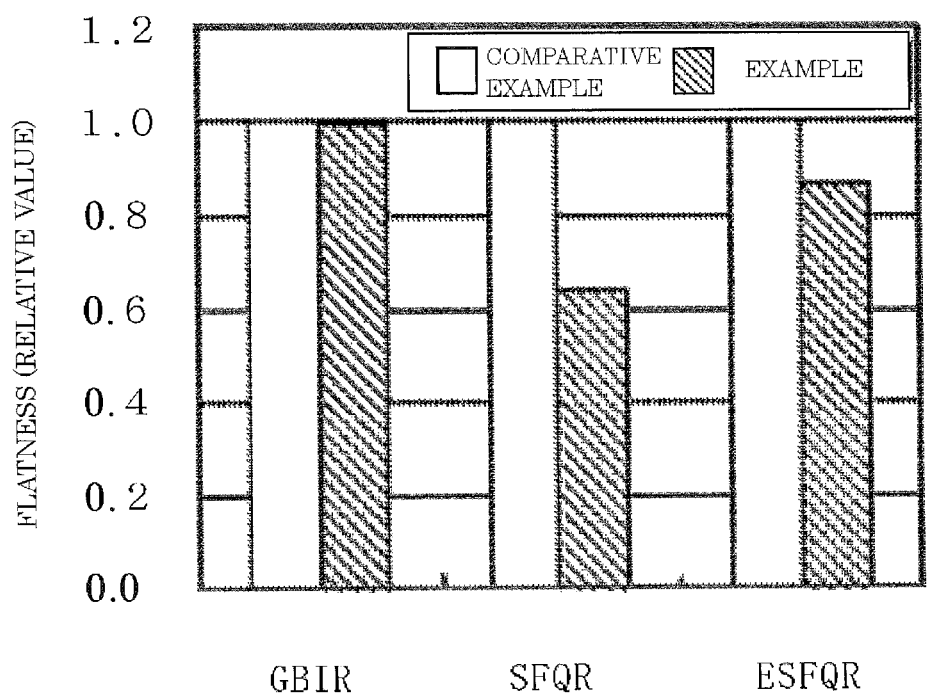
FIG. 5 shows the results of an example and a comparative example.
Figure 6:
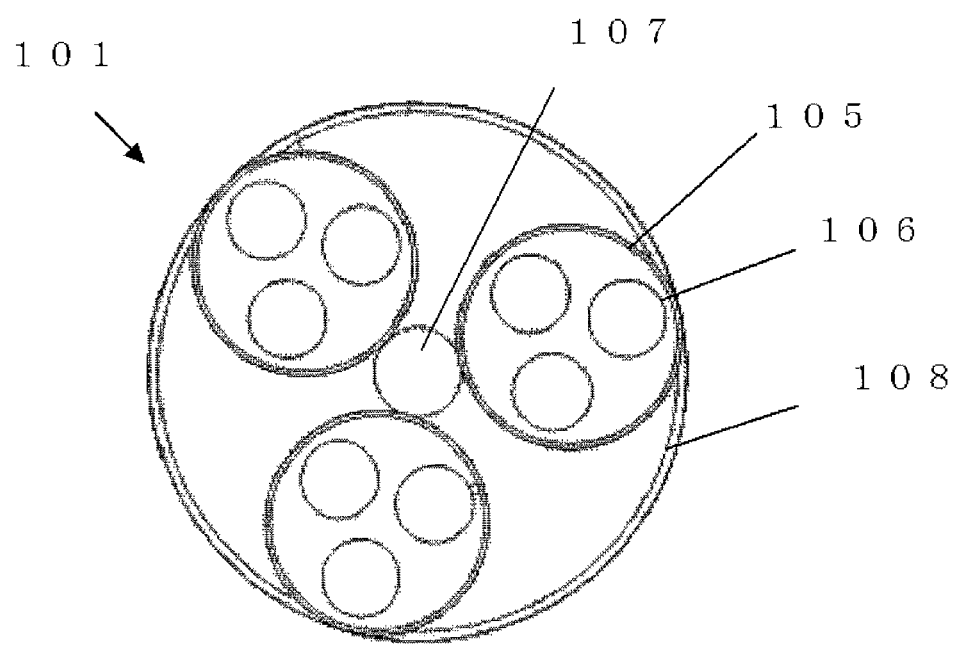
FIG. 6 is a schematic diagram of a common planetary gear type of double-side polishing apparatus.
Figure 7:
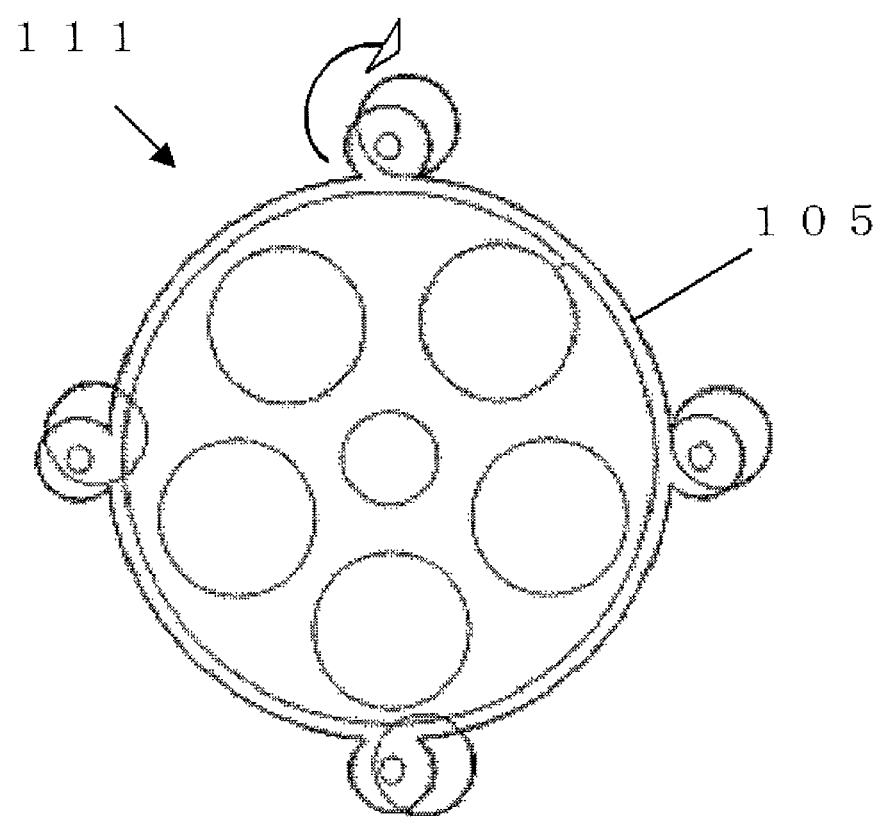
FIG. 7 is a schematic diagram of a common swinging type of double-side polishing apparatus.

As a result, both of the overall flatness and the circumferential flatness were improved to good values. FIG. 5 shows the result of the flatness, wherein the flatness in the later-described Comparative Example is converted to 1. As shown in FIG. 5, the GBIR, representing the overall flatness, in the Example and Comparative Example was good, but the SFQR and ESFQR, representing the circumferential flatness, in Example was better than those in Comparative Example.

Moreover, the in-line measurement of the flatness allowed the polishing to be completed without increase in processing time and hence decrease in productivity.

It was thus confirmed that the double-side polishing method of the present invention can stably improve the wafer flatness and also prevent from being affected by variations in the carrier thickness over time because the polishing conditions are determined without using the carrier thickness as a reference.

Comparative Example

Silicon single crystal wafers were polished under the same conditions as those of the first polishing batch in Example. The flatness of the polished wafer was measured with a flatness measuring instrument (Nanometro 300TT manufactured by KURODA Precision Industries Ltd.) provided separately from the double-side polishing apparatus, and the overall flatness was a convex shape and the circumferential flatness was a rise shape. Accordingly, the finishing thickness of the wafer in the second polishing batch was determined to be thinner than the thickness of the carrier to improve the overall flatness.

As a result, although the overall flatness was improved, the circumferential flatness became a steeper rise shape. As depicted in FIG. 5, the circumferential flatness became considerably worse than that of Example.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A double-side polishing method including interposing a wafer held by a carrier between upper and lower turn tables to which respective polishing pads are attached, and rotating and revolving the carrier while supplying a polishing agent to polish both surfaces of the wafer at the same time, the method comprising the steps of:
   first polishing at a high polishing rate;
   second polishing at a low polishing rate;
   measuring flatness of the polished wafer; and
   determining polishing conditions of the second polishing in a next polishing batch on a basis of the measured flatness,
   wherein the measured flatness includes overall represented by a cross-sectional shape passing through a center of the wafer and circumferential flatness represented by a sag shape or a rise shape of an outer circumference portion of the wafer, and
   wherein the step of determining the polishing conditions of the second polishing determines the polishing conditions such that, if the measured circumferential flatness is the rise shape, then a polishing load is decreased and a rotational speed of the upper and lower turn tables and a rotational speed of and a revolution speed of the carrier are increased compared with those of a current polishing batch, and if the measured circumferential flatness is the sag shape, then the polishing load is increased and the rotational speed of the upper and lower turn tables and the rotational speed of and the revolution speed of the carrier are decreased compared with those of the current polishing batch.

2. The double-side polishing method according to claim 1, wherein,
the step of determining the polishing conditions of the second polishing determines at least one of a polishing load, a rotational speed of the carrier, a revolution speed of the carrier, a rotational speed of the upper turn table, a rotational speed of the lower turn tables, and a polishing time.

3. The double-side polishing method according to claim 1, wherein,
if the measured circumferential flatness is the rise shape, then a polishing time of the first polishing is determined such that a finishing thickness becomes thicker than that of the current polishing batch, and if the circumferential flatness is the sag shape, then the polishing time of the first polishing is determined such that the finishing thickness becomes thinner than that of the current polishing batch.

4. The double-side polishing method according to claim 1, wherein,
if the measured circumferential flatness is the rise shape, then the polishing time of the first polishing is determined such that a finishing thickness becomes thicker than that of the current polishing batch, and if the circumferential flatness is the sag shape, then the polishing time of the first polishing is determined such that the finishing thickness becomes thinner than that of the current polishing batch.

* * * * *